United States Patent [19]
Sullivan

[11] Patent Number: 5,487,074
[45] Date of Patent: Jan. 23, 1996

[54] BOUNDARY SCAN TESTING USING CLOCKED SIGNAL

[75] Inventor: Patrick Sullivan, Chippewa Falls, Wis.

[73] Assignee: Cray Research, Inc., Eagan, Minn.

[21] Appl. No.: 406,571

[22] Filed: Mar. 20, 1995

[51] Int. Cl.[6] .................................................. G06F 11/00
[52] U.S. Cl. .......................................... 371/22.3; 371/22.5
[58] Field of Search .................................. 371/22.3, 22.5, 371/22.1, 22.2

[56] References Cited

PUBLICATIONS

"The ABCs of Boundary–Scan Test," Fluke and Philips—The Global Alliance in T&M, (1991).

*Primary Examiner*—Vincent P. Canney
*Attorney, Agent, or Firm*—Schwegman, Lundberg & Woessner

[57] ABSTRACT

An method and apparatus for testing the frequency characteristics of electrical connections between integrated circuits. The apparatus includes circuitry for transmitting a series of signals via the connection from one integrated circuit to another. Each signal of the series is transmitted at a different frequencies. The apparatus further includes circuitry for receiving the series of signals and generating an error signal for each frequency. The method includes sending the series of pre-determined signals from one integrated circuit to another and receiving the series of signals. The method further including the evaluation of the series of signals and the generation of error signals corresponding to each frequency.

14 Claims, 9 Drawing Sheets

BOUNDARY SCAN TESTING USING CLOCKED SIGNAL

TECHNICAL FIELD OF THE INVENTION

The present invention relates generally to boundary scan testing of electronic circuits and in particular the present invention relates to testing the electrical interconnect between components using a clocked signal.

BACKGROUND OF THE INVENTION

Electronic circuit boards in high technology applications have reached a point where testing the circuit board for continuity problems is not cost effective and often not possible. Traditional methods of testing circuit boards consisted of probing the integrated circuit input and output pins and selected points on the circuit board with test probes. The combination of surface mount technology and miniaturization of components has reduced or eliminated the physical space available for probe testing. Further, the reduced width of conductor traces on modern circuit boards makes probe testing even more difficult.

To overcome the problems encountered with probe testing, manufacturers have two testing techniques available. The first technique requires an actual functional test of the circuit board. This option is both time consuming and expensive. Functional testing is often not practical on the circuit board level and may have to be conducted on a system level, where the system may incorporate a large number of circuit boards. It can be seen that using this technique it can be difficult to isolate the cause of a faulty circuit.

The second testing technique involves the use of a test procedure such as boundary scan testing where test elements are built into the IC's populated on the circuit board. Boundary scan testing offers access to the input and output pins of the IC's on the printed circuit board by means of a test bus connecting the test elements. Boundary scan testing can provide an effective means for both board level and system-level testing. Because boundary scan technology is incorporated into the IC's, circuit boards can be built which are not testable using traditional probe testing technology.

Boundary scan testing involves a number of boundary scan cells inside each IC corresponding to each IC input and output pin so that signals at the IC's boundaries can be controlled and observed. Provisions, therefore, have to be made at the component level (IC) in order to use boundary scan testing at a system level.

Standard boundary scan testing techniques provide a means for testing both the connections between integrated circuits and the core logic of the integrated circuit. By using the boundary scan cells in the IC to isolate the IC from the rest of the circuit board, a test signal can be applied to the inputs of the IC and the outputs from the IC can be captured by the boundary scan cell associated with the output. The core logic of a given IC can therefore be tested. This test procedure can be conducted using a slow speed static test signal. A good description of a standard boundary scan test can be found in "The ABCs of Boundary-Scan Test", John Fluke Mfg. Co., 1991.

Boundary scan testing also provides a means for testing the connections between components on the circuit board. This is performed by applying a status test signal to the output of an IC, using the boundary scan cell associated therewith, and capturing the signal using the boundary scan cell associated with an input of another IC. This test technique is effective for testing the continuity between components after the circuit board has been populated. Because interconnect testing is conducted in a static condition, standard boundary scan testing does not provide a means for testing the circuit board connections in a simulated operational state. That is, the characteristics of a given connection between components on a printed circuit board cannot be tested under an operational clocked condition.

For the reasons stated above, and for other reasons stated below which will become apparent to those skilled in the art upon reading and understanding the present specification, there is a need in the art for a boundary scan test which can test and profile the connection between components in an operational clocked condition.

SUMMARY OF THE INVENTION

The above mentioned problems with boundary scan testing and other problems are addressed by the present invention and which will be understood by reading and studying the following specification. A boundary scan test using a clocked signal is described which tests and profiles the connection between components.

In particular, the present invention describes an apparatus for testing electrical connections between a plurality of integrated circuits. The apparatus comprises an integrated circuit chip, a plurality of electrical input and output connectors attached to the integrated circuit chip, a boundary scan cell connected to each of the plurality of input and output connectors, and boundary scan cell control logic located on the integrated circuit chip of each integrated circuit. The boundary scan cells associated with the output connectors of the integrated circuit comprise a register having an output which toggles in response to a clock signal. The boundary scan cells associated with the input connectors of the integrated circuit comprise a latch which latches a current state of the input connector, a register for storing a prior state of the input connector, and a comparator which compares the current and the prior states of the input connector and generates an error signal according to pre-determined criteria.

In an alternate embodiment, the apparatus has a plurality of integrated circuits are located on a circuit board and the connections between the plurality of integrated circuits are conductor traces on the circuit board. In another embodiment, the integrated circuit chip includes core logic.

In another embodiment, an apparatus is described for testing electrical connections between a plurality of integrated circuits. The apparatus comprises an integrated circuit chip having core logic, a plurality of electrical input and output connectors attached to the integrated circuit chip, a boundary scan cell connected to each of the plurality of input and output connectors and electrically located between the core logic and the input and output connectors, and boundary scan cell control logic located on the integrated circuit chip of each integrated circuit. The boundary scan cells associated with the output connectors of the integrated circuit comprise a register having an output which toggles in response to a clock signal. The boundary scan cells associated with the input connectors of the integrated circuit comprise a latch which latches a current state of the input connector, a register for storing a prior state of the input connector, and a comparator which compares the current and the prior states of the input connector and generates an error signal according to pre-determined criteria.

In yet another embodiment, a method is described for testing frequency characteristics of connections between interconnected integrated circuits. The method comprises the steps of transmitting a series of signals from a first boundary scan cell of a first integrated circuit to a second boundary scan cell of a second integrated circuit, each of the series of signals being sent at different frequencies. The second boundary scan cell receives the series of signals transmitted by the first boundary scan cell and evaluates each of the signals of the series of signals received by the second integrated circuit to determine if an error occurred during transmission. Error signals are generated corresponding to each frequency based on predetermined criteria. Operational frequency bandwidth can be characterized for each of the connections using the error signal corresponding to each of the frequencies.

In still another embodiment, a method is described for testing frequency characteristics and cross-talk of connections between interconnected integrated circuits comprising a plurality of boundary scan cells associated with a plurality of input and output connectors. The method comprises the steps of registering an initial signal state in a plurality of output boundary scan cells associated with a plurality of output connectors of a first integrated circuit, transmitting a clocked signal from the output boundary scan cells to a plurality of input boundary scan cells associated with input connectors of at least one second integrated circuit, receiving the transmitted clocked signals with the plurality of input boundary scan cells, evaluating the transmitted clocked signals received by the plurality of input boundary scan cells of the at least one second integrated circuit, and generating error signals for the received clocked signals based on predetermined criteria.

The initial states can be generated in either a random pattern or a predetermined pattern. In a further embodiment, a series of clocked signals is transmitted from the plurality of output boundary scan cells to the plurality of input boundary scan cells, each clocked signal of the series of clocked signals being transmitted at a different clock frequency. The series of transmitted clocked signals are received with the plurality of input boundary scan cells and evaluating. Error signals are generated for the received clocked signals based on predetermined criteria.

DETAILED DESCRIPTION OF THE INVENTION

In the following detailed description of the preferred embodiment, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical and electrical changes may be made without departing from the spirit and scope of the present inventions. The following detailed description is, therefore, not to be taken in a limiting sense, and the scope of the present inventions is defined only by the appended claims.

Boundary Scan Testing

To more fully understand the present invention, a more detailed discussion of a typical boundary scan test and boundary scan cell as known in the art are presented. For a detailed description of boundary scan cells see "The ABCs of Boundary-Scan Test", John Fluke Mfg. Co., 1991.

Figure 1:
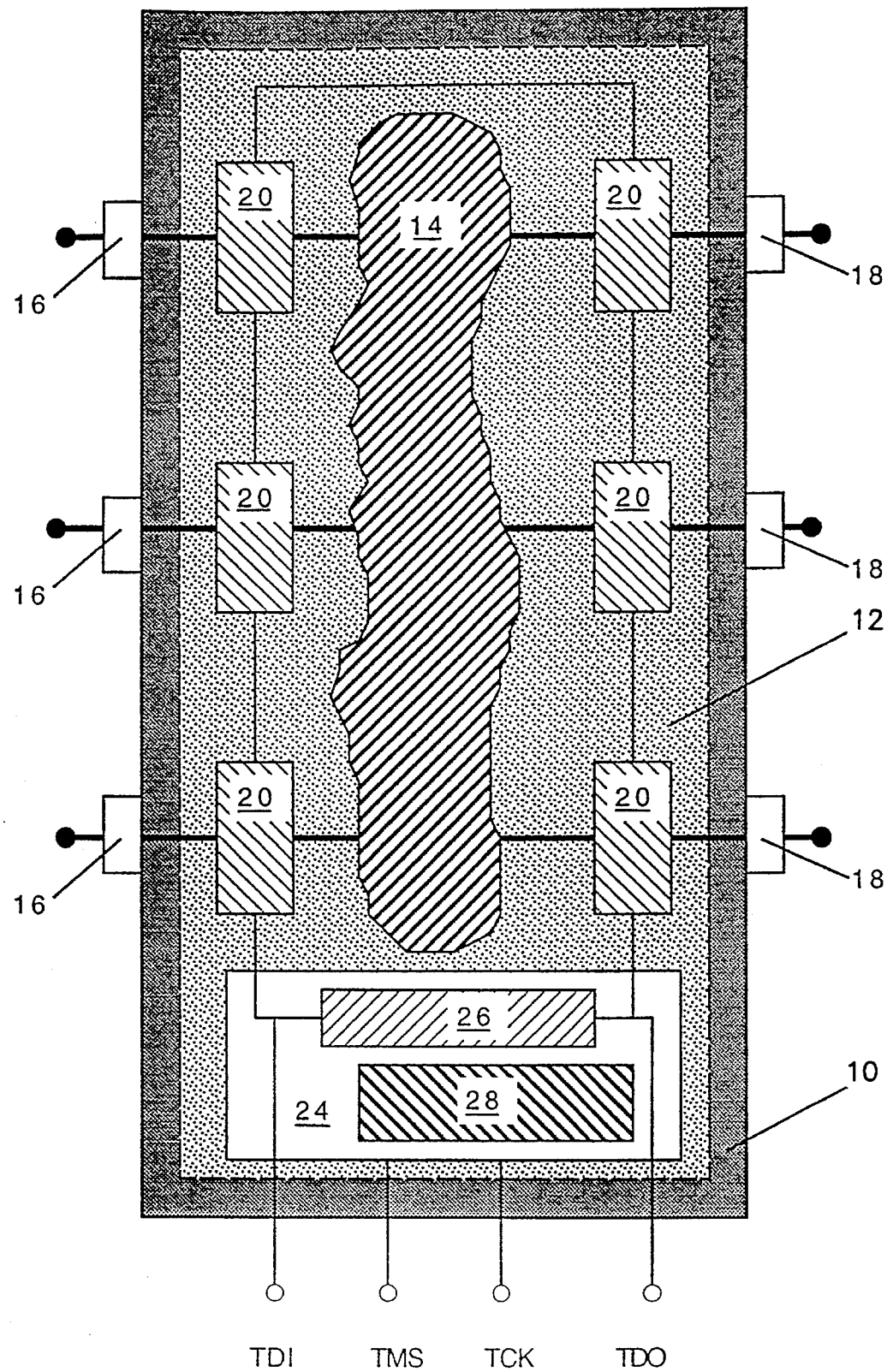
FIG. 1 is a block diagram of a typical integrated circuit incorporating typical boundary scan circuitry.
Figure 2:
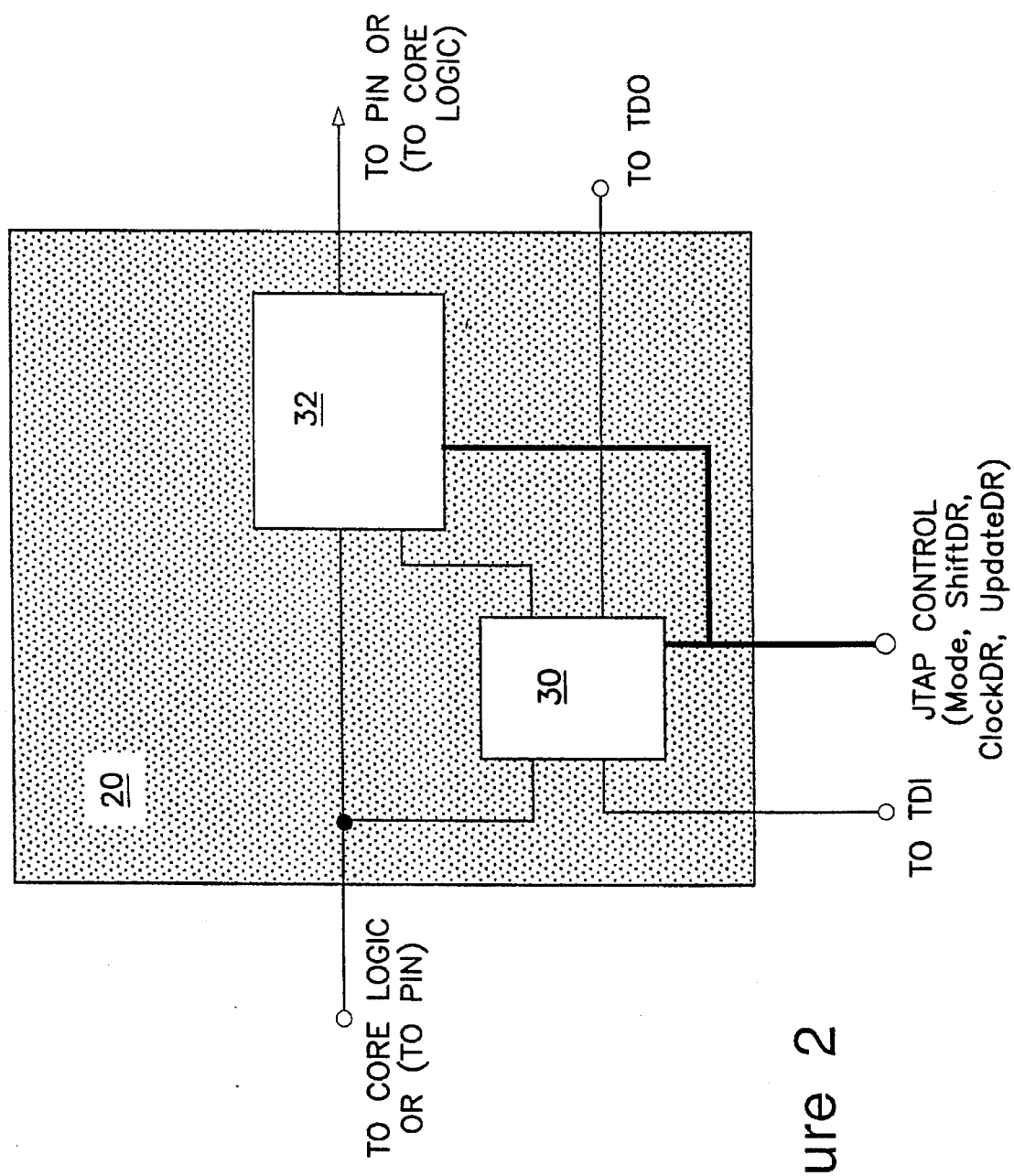
FIG. 2 is a block diagram of a typical boundary scan cell of FIG. 1.

Referring to FIGS. 1–2, boundary scan testing (BST) addresses the test node accessibility problem presented by highly populated circuit boards. This is accomplished by adding specialized circuitry to the IC packages populated on the circuit board. A typical integrated circuit (IC) 10 package comprises an integrated core logic 14 circuit chip 12 for performing a given function and input 16 and output 18 pins to connect the core logic with the rest of the circuit board. A boundary scan or host IC contains a boundary scan cell 20 (BSC) associated with each input and output pin of the IC. The boundary scan cell contains a shift-register stage 30 and can control and observe what happens at each input and output pin of the IC.

The BSC's 20 for each pin of a host IC 10 are interconnected to form a shift-register chain, or boundary scan register. The boundary scan register provides a serial path around the core logic 14 to provide test data and control signals to each boundary scan cell. Test data can be shifted, therefore, through the boundary scan register to access circuit locations which cannot be physically accessed with traditional probe technology.

Figure 3:
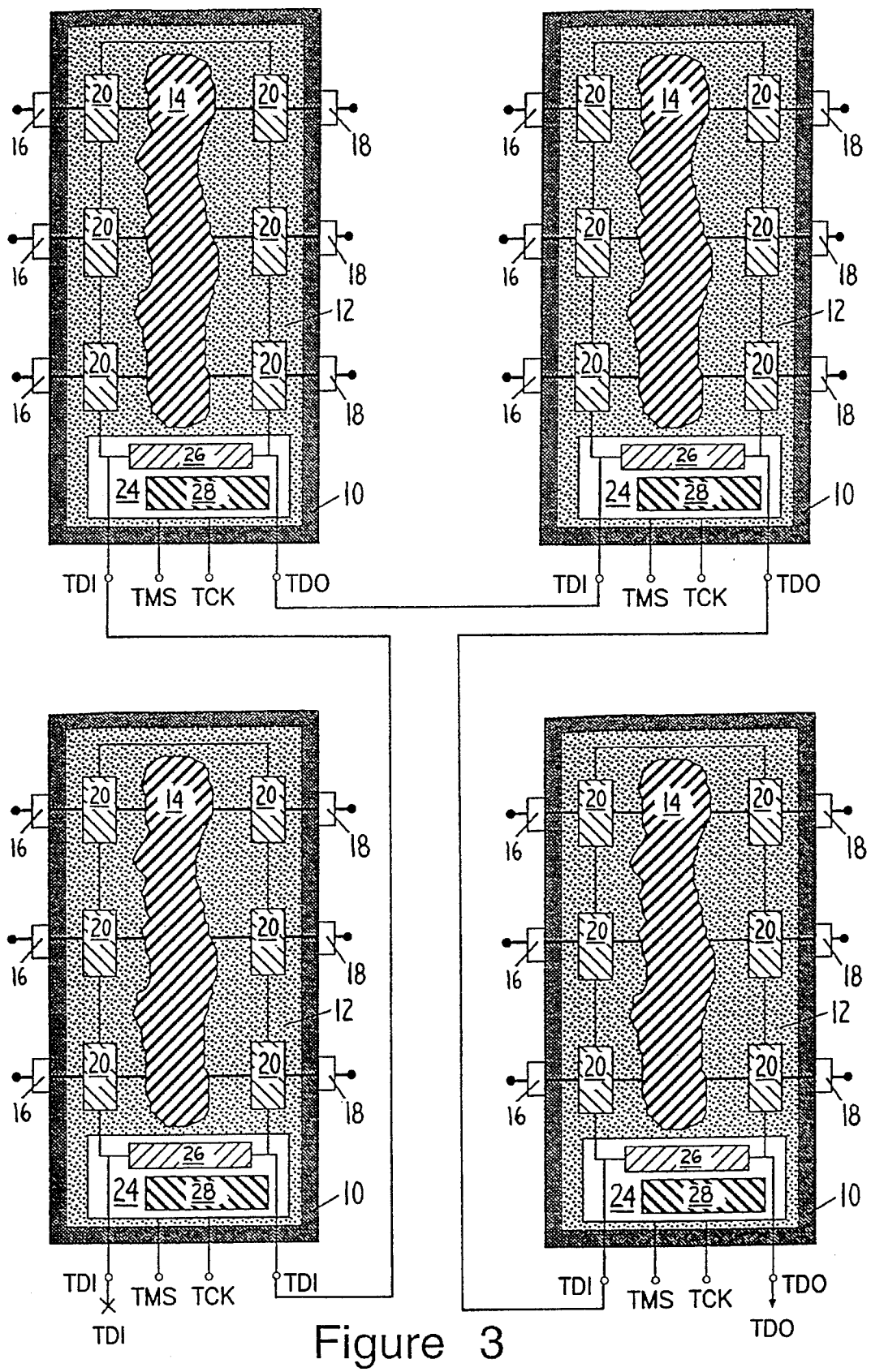
FIG. 3 shows typical integrated circuits of FIG. 1 with the boundary scan circuitry connected in series.

Boundary scan testing can be conducted either on an entire circuit system comprising a number of circuit boards and components by connecting the boundary scan cells of each component in series to form a single path through the complete circuit, as shown in FIG. 3. Alternatively, a circuit board can contain several independent serial boundary scan paths for critical circuits portions.

The boundary scan cells 20 of a host IC 10 are electrically transparent to the host IC during normal IC operation. However, when the boundary scan cells are being used for testing, a tap controller 24 located on the host IC allows a test signal to be shifted to each BSC and applied to an output of the BSC. Likewise, a signal applied to an input of a BSC from either the IC core logic or the IC input pin can be captured by the BSC and shifted out to the controller for inspection. The controller has four connections, TDI, TDO, TCK (clock), and TMS.

Figure 4:
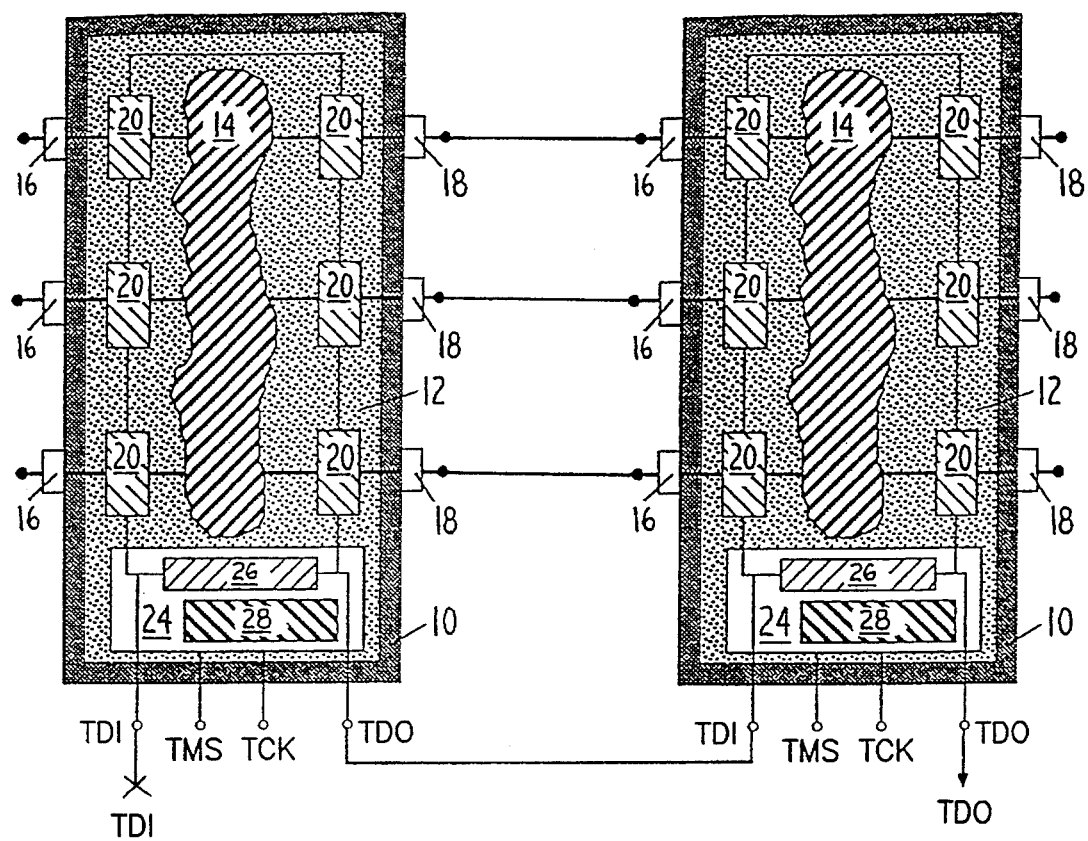
FIG. 4 shows typical integrated circuits of FIG. 1 configured to test the connections between the integrated circuits.

The core logic 14 of an IC 10 can be electrically isolated from the PCB and two types of tests can be conducted. First, the connections around an IC can be tested. To identify electrical opens or shorts, a static test signal can be applied to the output pins of one IC and evaluating the signal at the input pins of the surrounding IC's, as shown in FIG. 4. Secondly, internal IC tests can be conducted on the core logic. The test results are captured by the boundary scan cells and shifted through the boundary-scan cells towards the test data output pin.

Boundary scan testing used for internal testing of the host IC's core logic, electronically isolates the on-chip core logic from surrounding components. This technique allows the testing of the core logic of the IC without using a probe after the IC has been populated onto the circuit board. Further, a limited slow-speed static testing of the IC core logic can be accomplished in some boundary scan architectures. This is accomplished by applying a test signal (logic 1 or 0) to the inputs of the core logic with the BSC's associated with the input pins of the IC and capturing the test response of the core logic with the BSC's associated with the output pins of the IC.

As stated above, boundary scan testing can also be used for the testing of external connections between IC's by applying a static test signal (a logic 1 or 0) from the BSC's which are associated with the output pins of one IC and capturing the response in the BSC's which are associated with the input pins of a second IC electrically connected to the first IC. This technique allows the testing of interconnected IC's for continuity problems.

Referring to FIG. 1, the standard boundary-scan architecture is described in more detail. As stated above, the boundary scan test technique involves a series of boundary scan cells connected in series as shift-register stages. Each boundary scan IC has a tap controller 24 which generates the control signals required to shift, capture or update data through the boundary scan cells 20 in response to test instructions provided from external circuitry on the test mode selected line (TMS) and the shift register clock (TCK). The boundary scan IC 10 has a test data input line (TDI) and a test data output line (TDO) for shifting data into and out of the boundary scan cells 20.

Each IC 10 contains a bypass register 26 to bypass the BSC's 20 of the IC. An optional device identification register 28 can be included to provide information about the manufacturer's name, part number, and version number of the IC. These registers are addressable through an instruction code provided to the tap controller 24. Further, a manufacturer may add test data registers dedicated to his own design. For this purpose, a design-specific test data register can be provided when necessary (not shown). The bypass register 26 is a single stage shift-register which provides a minimum length serial path for the test data shifting from the IC's test data input to its test data output. The benefit of the bypass register is a shortened scan path through a series of IC's, thereby, providing a bypass around IC's not requiring access. As stated above, the boundary scan register consists of a series of boundary scan cells arranged to form a scan path around the boundary of the core logic of the host IC.

Typical Boundary Scan Cell

A typical boundary scan cell 20 comprises a shift register stage 30, as shown in FIG. 2. The typical boundary scan cell can be used for both the input and output functions of the host IC. As one skilled in the art will recognize, the BSC can be simplified for pins dedicated to either input or output functions. For the output function, in response to the clock, the shift register of the BSC captures the serial data provided on the TDI line and provides the appropriate signal to the output pin of the IC. For the input function, in response to the clock, the shift register 30 of the BSC captures the signal provided at the input pin of the IC and shifts the signal out of the BSC to the TDO line. As stated above, the BSC can isolate the core logic from the exterior circuit and provide a selected signal to the core logic for testing the core logic. This can be achieved using a disable circuit 32 to either disconnect the core logic from the IC pin, or connect the core logic to the shift register 30 in response to a control signal from the controller. The typical BSC, therefore, provides a means for transmitting and receiving a static signal between connected pins of integrated circuits for testing the continuity between IC's.

Boundary Scan Cell using a Clocked Signal

Figure 5:
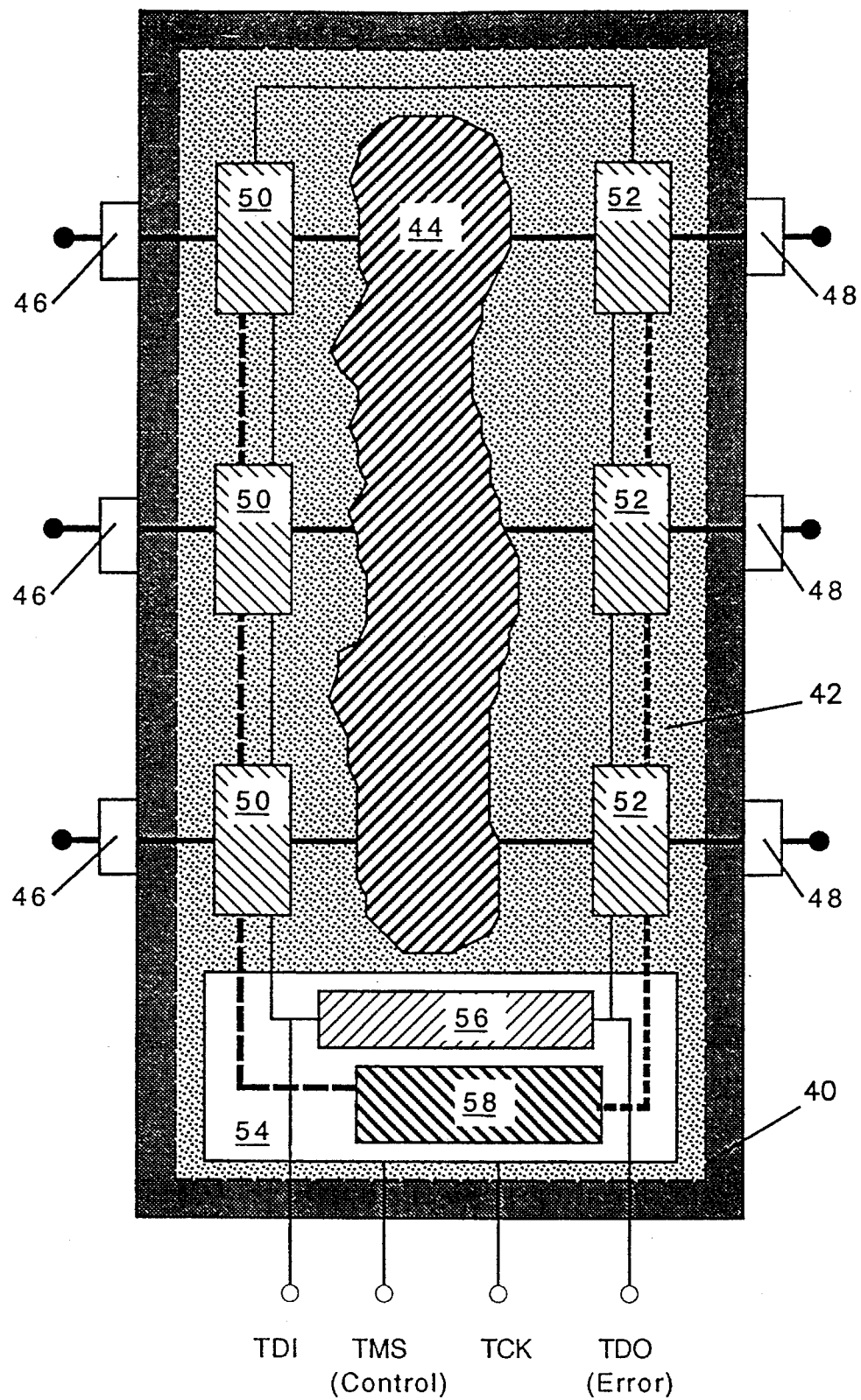
FIG. 5 is a block diagram of an integrated circuit incorporating some of the features of the present invention.

In the preferred embodiment of the present invention, boundary scan cells are provided to transmit and receive a synchronized signal between the input and output pins of integrated circuits connected in a circuit. Each host integrated circuit 40 included in a boundary scan test comprises an integrated circuit chip 42 having core logic 44 for performing a given function, input 46 and output 48 pins to connect the core logic with the rest of the circuit, and a boundary scan cell 50 (BSC) associated with each input and a boundary scan cell 52 (BSC) associated with each output pin of the IC, as illustrated in FIG. 5. The input pin boundary scan cells 50 have the normal boundary scan modes of operation plus a "high speed compare" mode that provides the capability to compare the current incoming logic state (0 or 1) to the previous incoming state (0 or 1). The output pin boundary scan cells 52 have the normal boundary scan modes of operation plus a "high speed toggle" mode that provides the capability to toggle the current outgoing logic state each clock cycle. The boundary scan cells 50 are electrically located between input pin and the core logic. The boundary scan cells 52 are electrically located between the core logic and the output pins. The boundary scan IC 42 includes a bypass circuit 56 for bypassing the IC and "high speed" control circuit 58 for controlling the BSC's during high speed toggle operation. It will be understood that the clock of the input and output boundary scan cells 50, 52 can be operated independently.

The BSC's 50 for each input pin 46 of a host IC 40 are interconnected with the BSC's 52 for each output pin 48 of a host IC 40 to form a shift-register chain. The shift-register chain provides a serial path for test data and control signals to each boundary scan cell 50 and 52. Each host IC 40 has a tap controller 54 which generates the control signals required to control the boundary scan cells in response to test instructions provided from external circuitry on the control line. The controller also distributes a clock signal provided on the clock input line (TCK) to all boundary scan cells. The controller also has a test data input line (TDI) and test data output (TDO). The BSC's 50 TDO's can function as a compare error output line, when BSC's 50 are is in high speed compare mode.

Figure 6:
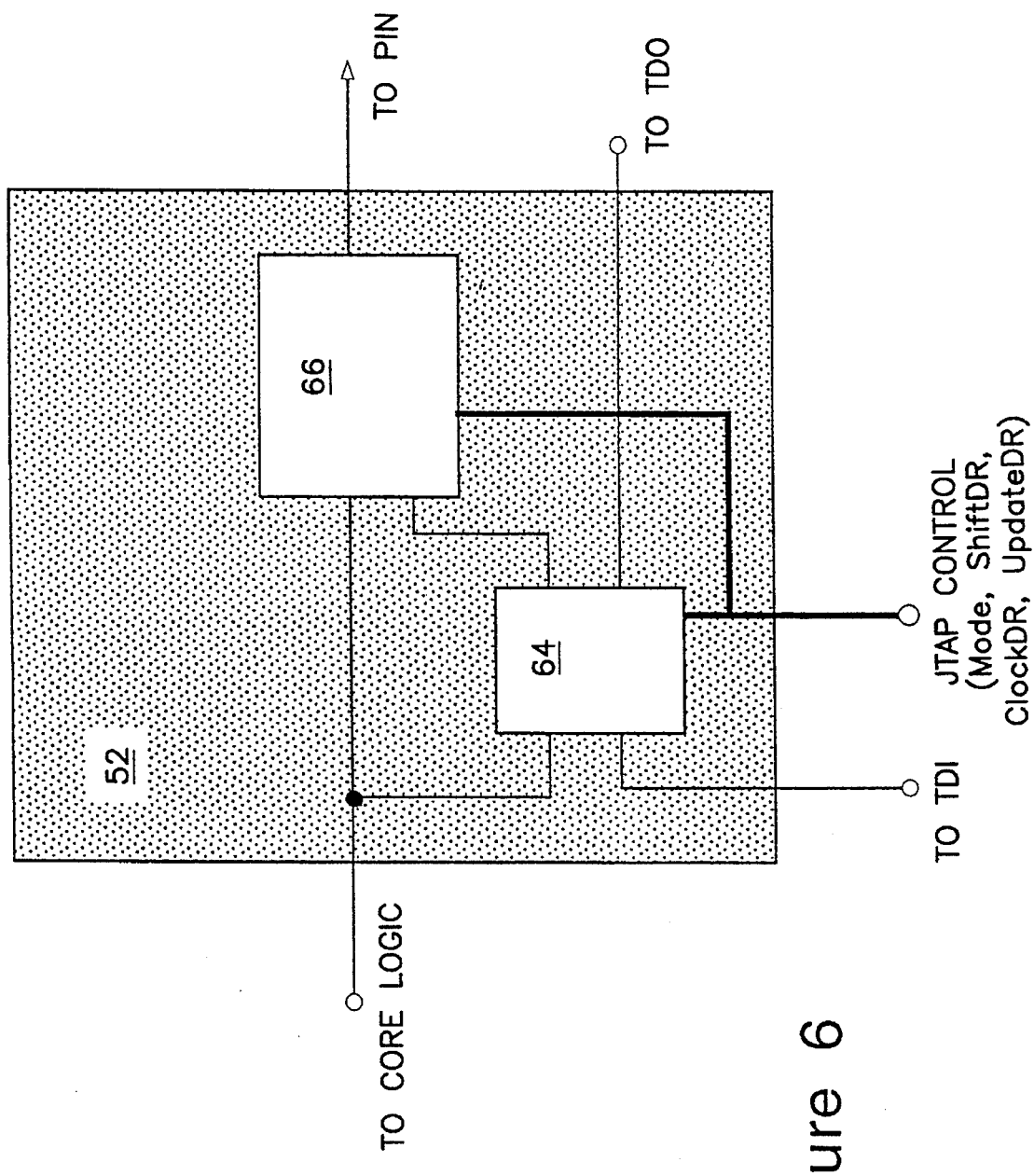
FIG. 6 is a block diagram of an output boundary scan cell of FIG. 5.
Figure 7:
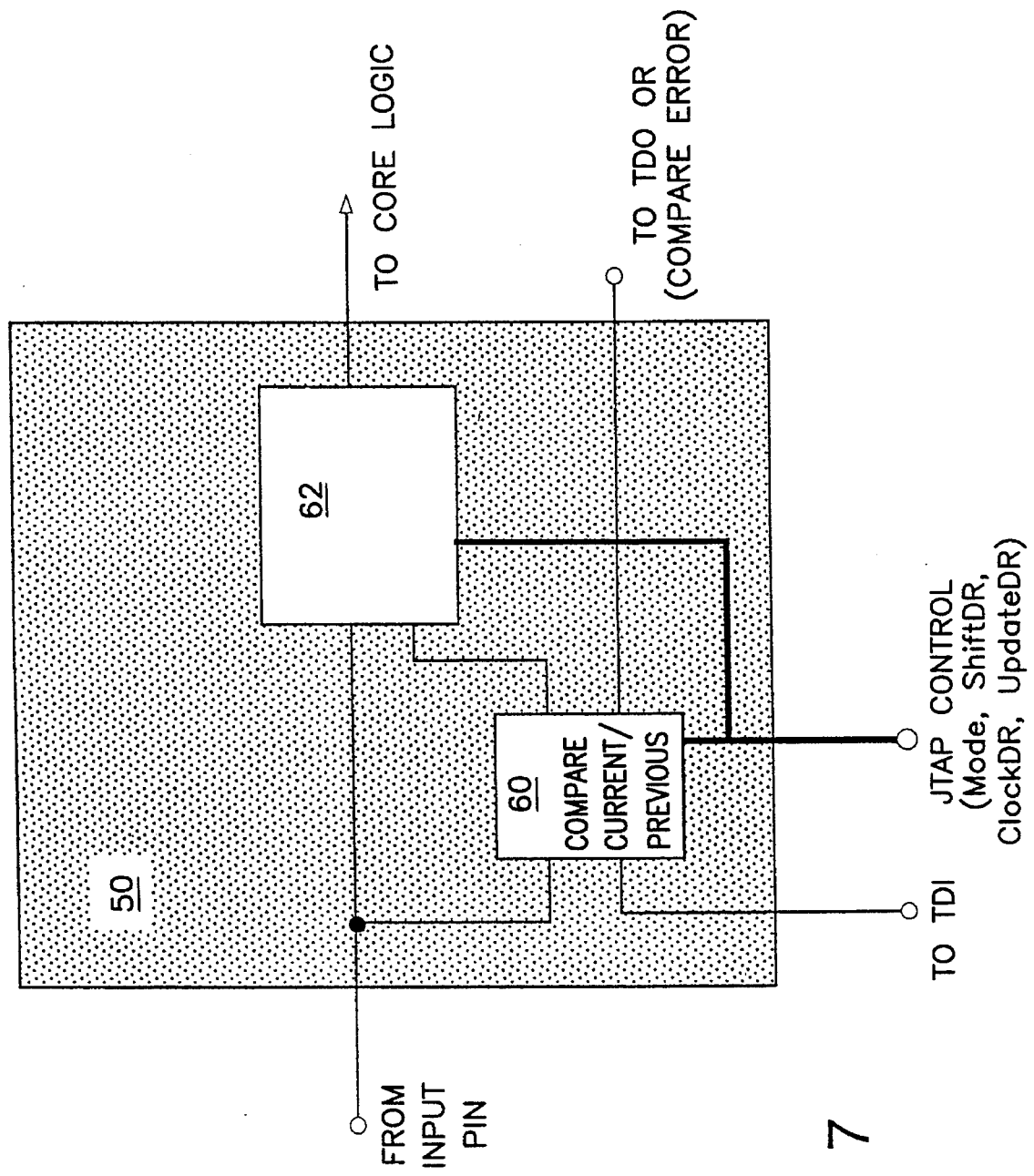
FIG. 7 is a block diagram of an input boundary scan cell of FIG. 5.

Therefore, the boundary scan cells 50, 52 associated with the input 46 and output 48 pins, respectively, of an integrated circuit 40 perform different functions, when in "high speed" operation and preferably have different elements. The output BSC 52 has a test data input line (TDI) to set initial state and a test data output line for shifting error data out of the output boundary scan cell, as shown in FIG. 6. The input BSC 50 has a test data input line (TDI) to set the initial state and a test data output line for shifting data out of the boundary scan cell, as shown in FIG. 7. This allows forcing of a compare fault for testing the compare circuitry.

The output BSC 52 has a shift register circuit 64 for receiving and storing an initial output state provided on the test data input line and a toggle latch circuit 66 for changing output states in response to a clock signal provided on the tap control line connected to controller 54, shown generally as a dashed line in FIG. 5. It will be recognized by one skilled in the art that any circuit capable of receiving and storing an electrical state can be used in the output BSC 52 and the present invention is not limited to a shift register circuit.

The output state of the output BSC 52 of one IC is communicated to the input boundary scan cells 50 associated with IC input pins 46 of a second IC electrically connected to the output pin of the first IC. The input BSC 50 has both a receiving latch circuit 62 for receiving and latching the present state of the input of the IC and a shift register, as shown in FIG. 7, for storing the prior state of the IC input corresponding to a prior clock pulse provided on the clock input line. A comparator/latch circuit 60 is included with the input BSC 50 to both latch the prior state and compare the present and prior states of the IC input. BSC 52 is connected to the controller 54 and high speed circuit 58 through the tap control line, shown generally as a dashed line in FIG. 5. An error indicator is generated by the comparator/latch circuit 60 if the present and prior states are the same and output on the TDO line. It will be recognized by one skilled in the art that any circuit capable of receiving and storing the present and prior electrical states of an input can be used in the input BSC and the present invention is not limited to a latch and shift register circuits.

Similar to the traditional boundary scan test, both the input 50 and output 52 BSC's latch circuits 62 and 66, respectfully, can have disabling circuits included for isolating the core logic of the host IC from the external circuit.

In operation, the controller 54 isolates the core logic 44 from the IC pins 46, 48 and enables the output BSC 52 for transmission via the IC output pins. An initial output state is then shifted to the output boundary scan cells using the TDI line. In the preferred embodiment, the shift registers 64 in the output BSC's 52 allow different output BSC's to start at a different initial output state. Alternatively, a second embodiment can start all of the output BSC's at the same initial state, thereby eliminating the need for the shift register circuit.

Figure 8:
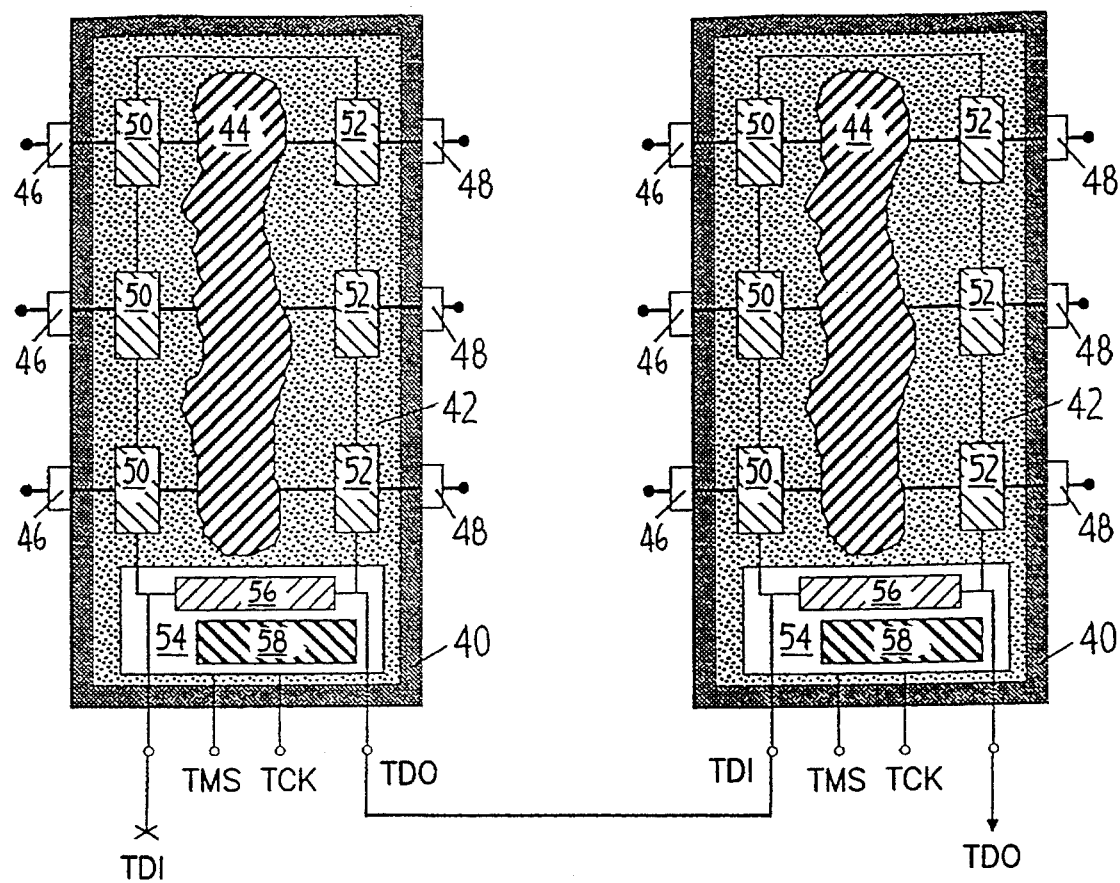
FIG. 8 shows integrated circuits of FIG. 5 configured to test the connections between the integrated circuits.

Referring to FIG. 8, to test the circuit connections between more than one IC the toggle latch circuit 66 of the output BSC 52 toggles the output of the IC output pin 48 to an opposite state in response to a clock signal provided from external circuitry on the clock input line. On each clock signal the present state of the input pin 46 of an IC is shifted to the comparator/latch circuit 60 of the input BSC 50 and then the receiving latch 62 of the input BSC latches the new state of the input pin. The timing of the latch and comparator circuit is such that the comparator circuit holds the prior state of the input pin and the latch hold the present state of the input pin. Because the signal generated by the output BSC is toggled on each clock pulse, absent an error, the present and prior states of an input pin should be opposite. The comparator/latch circuit 60 in the input BSC 50 compares the present and prior states and produces an error signal on the error line if the states are the same. In the preferred embodiment, the error signal is stored in the BSC 50 and shifted out of the IC 40 at the completion of a test. The input BSC's 50 are, therefore, connected in series via an error output line (TDO) such that the error state of each BSC can be shifted to the controller of each IC for analysis, as illustrated in FIG. 1. In an alternate embodiment, the error signal of each input BSC can be shifted to the controller on each clock pulse to provide for continuous monitoring of the BSC's.

To test a circuit's frequency characteristics, the frequency of the clock signal can be varied and a series of signals transmitted from one integrated circuit to another. The boundary scan tester, therefore, provides an apparatus for testing the frequency or transmission line characteristics of the connections between IC's in a circuit. It will be understood that by running a series of tests at different clock frequencies and generating error signals for each frequency, the maximum and minimum error free operational frequencies of each connection can be determined. These frequencies can be plotted to characterize the operational frequency bandwidth of each connection in a circuit. Similarly, the weakest, or most frequency sensitive connections can be identified. In the preferred embodiment, the outputs of the IC's can start at different initial conditions so that the cross talk between circuit connections will be more significant. The presence of cross talk provides for a more complete evaluation of the circuit connections.

Likewise, a matrix of tests can be conducted on a circuit by varying both internal and external parameters of a circuit, such as the operating voltage of the circuit and electrical noise generated outside the circuit. By varying the power and ground of a circuit, the susceptibility of a connection to changes in logic level switching points can be evaluated. Further, the power and ground plane integrity of a circuit board can be tested as different signals are transmitted between integrated circuits. The present invention, therefore, provides a tool for testing circuits at both the initial design stage and in production. Further, a frequency map of each completed circuit can be generated and used as a template for future evaluations of each circuit should an intermittent problem occur during its operation. Because operational failures often occur only when the circuit is subjected to a specific condition, static testing will often not identify the problem and merely frustrate the process of eliminating the circuit failure. Finally, the clocks of both the input boundary scan cells 50 and the output boundary scan cells can be varied to identify the clock skew margin. That is, the clocks can be fine tuned to determine how far out of synchronization they can be without generating errors. If the clock skew margin is narrow in a finished product, intermittent errors may occur during operation.

Figure 9:
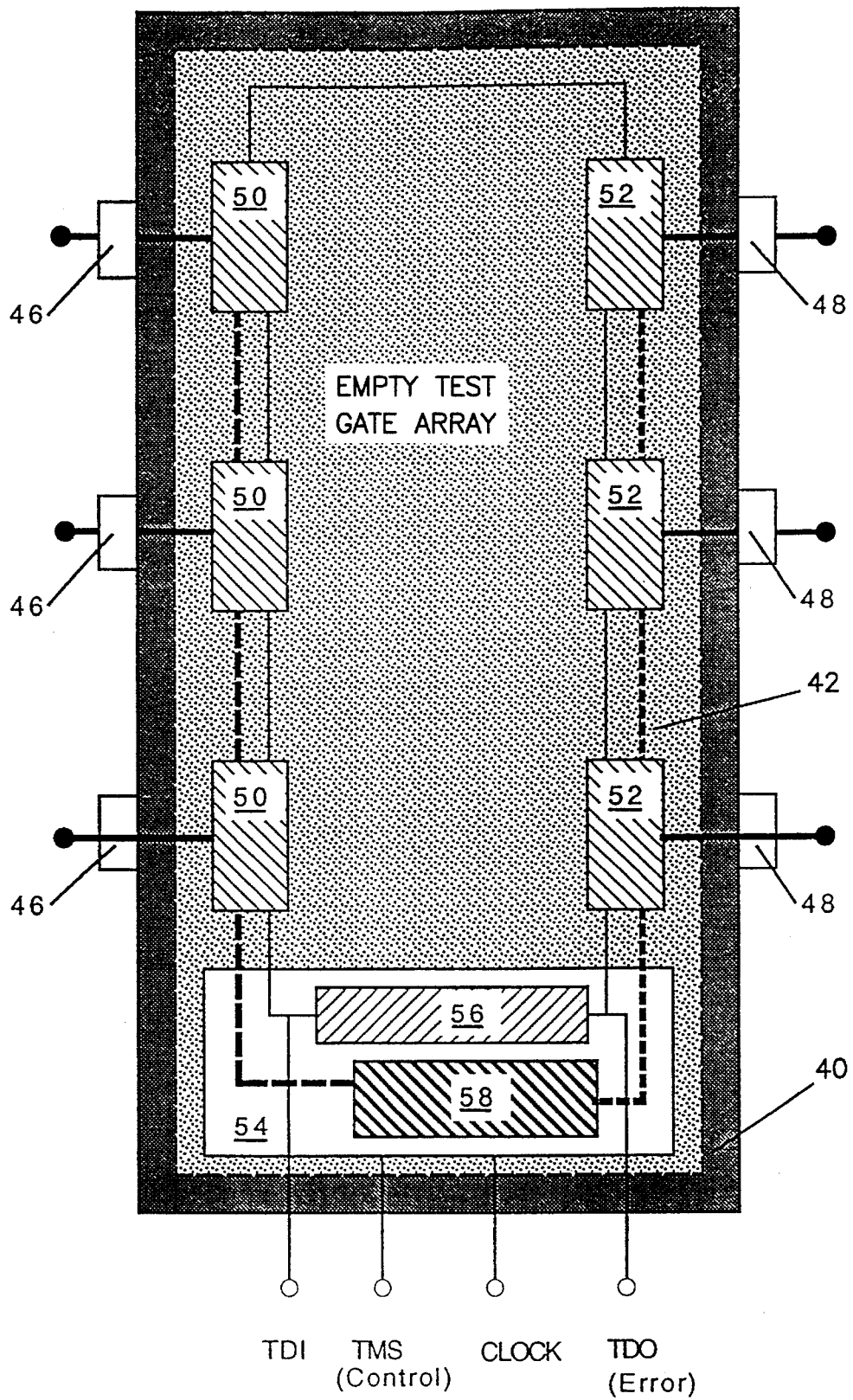
FIG. 9 is a block diagram of an alternate embodiment of an integrated circuit incorporating some of the features of the present invention.

In another embodiment, boundary cells 50 and 52 can be implemented on test IC's which do not contain core logic, as illustrated in FIG. 9. These IC's can be substituted for IC's intended for final population in the circuit to testing the circuit connections. This embodiment provides a tool for circuit designers to evaluate prototype circuit layouts without dedicating IC real estate in the final circuit for the boundary test circuitry. Although software evaluations of new circuit layouts can identify a variety of design problems, they cannot fully evaluate the performance of a circuit under real operational conditions. Some variables must be estimated and, as a result, can compromise the integrity of the analysis of the circuit layout. These variables can be tested in a true setting using the test IC's. It will be understood by one skilled in the art that any pre-determined signal can be transmitted from one IC to another and that the present invention is not limited to a toggled signal. The circuit of the present invention, provides a circuit for transmitting and receiving a signal between integrated circuits for testing both the continuity between components and the frequency characteristics of the circuit connections. As one skilled in the art will recognize, the transmission line characteristics of the connections of a circuit, such as conductor traces between components, can be tested in a design development stage to identify errors which may effect a circuit's performance. Further, by varying the clock frequency used for testing, the maximum clock frequency for a circuit can be determined and the most clock sensitive areas identified. Further, by transmitting opposite signals over independent connections simultaneously, cross talk between connections can be evaluated.

What is claimed is:

1. Apparatus for testing electrical connections between a plurality of integrated circuits each integrated circuit comprising an integrated circuit chip;

a plurality of electrical input and output connectors attached to the integrated circuit chip;

a boundary scan cell connected to each of the plurality of input and output connectors; and boundary scan cell control logic located on the integrated circuit chip of each integrated circuit;

the boundary scan cells associated with the output connectors of the integrated circuit comprising a register having an output which toggles in response to a clock signal;

the boundary scan cells associated with the input connectors of the integrated circuit comprising a latch which latches a current state of the input connector, a register for storing a prior state of the input connector, and a comparator which compares the current and the prior states of the input connector and generates an error signal according to pre-determined criteria.

2. The apparatus of claim 1 where the plurality of integrated circuits are located on a circuit board and the connections between the plurality of integrated circuits are conductor traces on the circuit board.

3. The apparatus of claim 1 where the integrated circuit chip includes core logic.

4. Apparatus for testing electrical connections between a plurality of integrated circuits each integrated circuit comprising an integrated circuit chip having core logic;

a plurality of electrical input and output connectors attached to the integrated circuit chip;

a boundary scan cell connected to each of the plurality of input and output connectors and electrically located between the core logic and the input and output connectors; and boundary scan cell control logic located on the integrated circuit chip of each integrated circuit;

the boundary scan cells associated with the output connectors of the integrated circuit comprising a register having an output which toggles in response to a clock signal;

the boundary scan cells associated with the input connectors of the integrated circuit comprising a latch which latches a current state of the input connector, a register for storing a prior state of the input connector, and a comparator which compares the current and the prior states of the input connector and generates an error signal according to pre-determined criteria.

5. The apparatus of claim 4 where the plurality of integrated circuits are located on a circuit board and the connections between the plurality of integrated circuits are conductor traces on the circuit board.

6. A method for testing frequency characteristics of connections between interconnected integrated circuits, the method comprising the steps of:

transmitting a series of signals from a first boundary scan cell of a first integrated circuit to a second boundary scan cell of a second integrated circuit, each of the series of signals being sent at different frequencies;

receiving at the second boundary scan cell the series of signals transmitted by the first boundary scan cell;

evaluating each of the signals of the series of signals received by the second integrated circuit to determine if an error occurred during transmission; and generating an error signal corresponding to each frequency based on predetermined criteria.

7. The method of claim 6 further including the step of characterizing an operational frequency bandwidth of the connections using the error signal corresponding to each of the frequencies.

8. A method for testing frequency characteristics and cross-talk of connections between interconnected integrated circuits comprising a plurality of boundary scan cells associated with a plurality of input and output connectors, the method comprising the steps of:

registering an initial signal state in a plurality of output boundary scan cells associated with a plurality of output connectors of a first integrated circuit;

transmitting a clocked signal from the plurality of output boundary scan cells to a plurality of input boundary scan cells associated with input connectors of at least one second integrated circuit;

receiving the transmitted clocked signals with the plurality of input boundary scan cells;

evaluating the transmitted clocked signals received by the plurality of input boundary scan cells of the at least one second integrated circuit; and generating error signals for the received clocked signals based on predetermined criteria.

9. The method of claim 8 where the initial state of the plurality of output boundary scan cells is generated in a random pattern.

10. The method of claim 8 where the initial state of the plurality of output boundary scan cells is generated in a pre-determined pattern.

11. The method of claim 8 further including the steps of;

transmitting a series of clocked signals from the plurality of output boundary scan cells to the plurality of input boundary scan cells, each clocked signal of the series of clocked signals being transmitted at a different clock frequency;

receiving the series of transmitted clocked signals with the plurality of input boundary scan cells;

evaluating the transmitted clocked signals received by the plurality of input boundary scan cells; and generating additional error signals for the received clocked signals based on additional predetermined criteria.

12. The method of claim 8 further including the steps of;

varying power supply levels for the integrated circuits;

transmitting a series of clocked signals from the plurality of output boundary scan cells to the plurality of input boundary scan cells, each clocked signal of the series of clocked signals being transmitted at a different clock frequency;

receiving the series of transmitted clocked signals with the plurality of input boundary scan cells;

evaluating the transmitted clocked signals received by the plurality of input boundary scan cells; and generating additional error signals for the received clocked signals based on additional predetermined criteria.

13. The method of claim 12 further including the step of varying clocks associated with the plurality of output boundary scan cells and the plurality of input boundary scan cells to identify a clock skew margin between boundary scan cells.

14. The method of claim 8 where at least one of the integrated circuits contains core logic.

* * * * *